（12) United States Patent
Pahl et al.

(10) Patent No.: US 9,844,128 B2
(45) Date of Patent: Dec. 12, 2017

(54) CASED ELECTRICAL COMPONENT

(75) Inventors: Wolfgang Pahl, München (DE);
Jürgen Portmann, München (DE)

(73) Assignee: SnapTrack, Inc., San Diego, CA (US)

( * ) Notice: Subject to any disclaimer, the term of this patent is extended or adjusted under 35 U.S.C. 154(b) by 845 days.

(21) Appl. No.: 13/994,091

(22) PCT Filed: Nov. 22, 2011

(86) PCT No.: PCT/EP2011/070691
§ 371 (c)(1),
(2), (4) Date: Oct. 23, 2013

(87) PCT Pub. No.: WO2012/079927
PCT Pub. Date: Jun. 21, 2012

(65) Prior Publication Data
US 2014/0036466 A1    Feb. 6, 2014

(30) Foreign Application Priority Data

Dec. 16, 2010    (DE) ................ 10 2010 054 782

(51) Int. Cl.
*H05K 1/02*    (2006.01)
*H05K 3/22*    (2006.01)
(Continued)

(52) U.S. Cl.
CPC ........... *H05K 1/0271* (2013.01); *H01L 23/04* (2013.01); *H01L 23/10* (2013.01);
(Continued)

(58) Field of Classification Search
CPC ........ H05K 1/0271; H05K 3/22; H01L 23/04; H01L 23/10; H01L 23/49811;
(Continued)

(56) References Cited

U.S. PATENT DOCUMENTS 5,772,451 A * 6/1998 Dozier, II ............ B23K 20/004
257/E21.503
6,290,510 B1    9/2001 Fork et al.
(Continued)

FOREIGN PATENT DOCUMENTS

DE    19806818 C1    11/1999
DE    10016132 A1    10/2001
(Continued)

OTHER PUBLICATIONS

"International Search Report and Written Opinion—PCT/EP2011/070691—ISA/EPO—dated Mar. 9, 2012".

*Primary Examiner* — Jenny L Wagner
*Assistant Examiner* — Michael P McFadden
(74) *Attorney, Agent, or Firm* — Patterson & Sheridan, L.L.P

(57) ABSTRACT

The invention relates to a cased electrical component comprising a carrier substrate (10), a spring device (20), which is arranged on the carrier substrate (10), a chip (30), which on a first side (31) of the chip is coupled to the spring device (20), and a cover element (100), which is arranged on the carrier substrate (10). The cover element (100) is arranged over the chip (20) such that the cover element (100) is in contact with the chip (30) at least on a second side (32) of the chip, which is different from the first side. The component has a low space requirement and is highly sealed with respect to influences from the surroundings.

6 Claims, 5 Drawing Sheets

Figure 1:
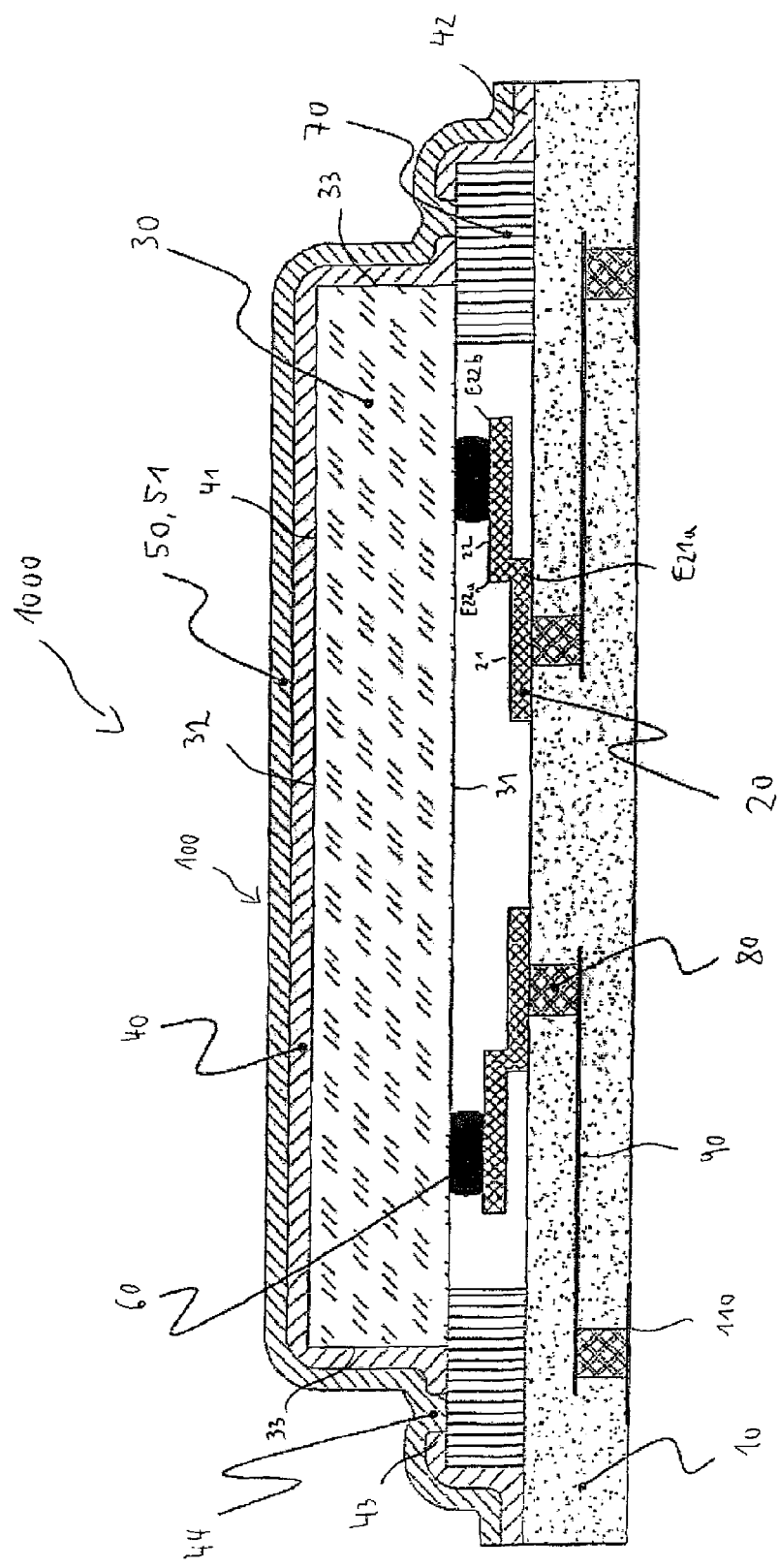

(51) Int. Cl.
  *H01L 23/10* (2006.01)
  *H01L 23/04* (2006.01)
  *H01L 23/498* (2006.01)
  *H01L 23/552* (2006.01)
(52) U.S. Cl.
  CPC ...... *H01L 23/49811* (2013.01); *H01L 23/552* (2013.01); *H05K 3/22* (2013.01); *H01L 2224/16225* (2013.01); *H01L 2924/09701* (2013.01); *H01L 2924/1461* (2013.01)
(58) Field of Classification Search
  CPC ......... H01L 23/552; H01L 2224/16225; H01L 2924/09701
  USPC .......................................................... 361/769
  See application file for complete search history.

(56) References Cited

U.S. PATENT DOCUMENTS

| | | |
|---|---|---|
| 6,492,194 B1 | 12/2002 | Bureau et al. |
| 7,145,283 B2 | 12/2006 | Takeuchi et al. |
| 7,388,281 B2 | 6/2008 | Krueger et al. |
| 2006/0032050 A1 | 2/2006 | Canella |
| 2006/0043604 A1 | 3/2006 | Suga et al. |
| 2006/0151203 A1* | 7/2006 | Krueger ............... H03H 9/0557 174/260 |
| 2006/0197232 A1 | 9/2006 | Tay et al. |
| 2007/0069354 A1 | 3/2007 | Dangelmaier et al. |
| 2009/0093136 A1* | 4/2009 | Hiew .................... G06F 1/1632 439/55 |
| 2009/0127697 A1 | 5/2009 | Pahl |
| 2009/0140433 A1* | 6/2009 | Bloom ................. B81B 7/0006 257/773 |
| 2009/0232336 A1 | 9/2009 | Pahl |

FOREIGN PATENT DOCUMENTS

| | | |
|---|---|---|
| DE | 10136743 A1 | 2/2003 |
| DE | 10329329 A1 | 2/2005 |
| DE | 102004040465 A1 | 5/2005 |
| DE | 102005050398 A1 | 4/2007 |
| DE | 102006025162 B3 | 1/2008 |
| EP | 1468776 A2 | 10/2004 |
| JP | 2004537178 A | 12/2004 |
| JP | 2005536879 A | 12/2005 |
| JP | 2006066808 A | 3/2006 |
| JP | 2009239235 A | 11/2009 |
| JP | 2009539235 A | 11/2009 |
| KR | 19990029047 | 4/1999 |
| WO | WO-2007137568 A1 | 12/2007 |

* cited by examiner

CASED ELECTRICAL COMPONENT

The invention relates to a cased component in which a thermomechanical stress loading on a chip in the interior of the casing is reduced. The invention furthermore relates to a method for housing chips in a stress-reduced fashion.

A cased component has a chip in the interior, which chip can contain an integrated circuit or on which chip, for example, metallic structures for producing an acoustic wave are arranged. The chip is generally arranged on a carrier substrate and surrounded by a casing. In most cases, the coefficient of thermal expansion of the chip differs from the coefficient of thermal expansion of the material of the carrier substrate and/or of the housing. As a result, in the event of temperature changes, mechanical loadings of the internal electrical connections between chip and carrier substrate occur, which can lead to failures of the component depending on the loading intensity. Furthermore, the temperature-dictated stress or else mechanical strains introduced externally, for example via a printed circuit board, can impermissibly influence the electrical characteristic variables of sensitive chips, for example of MEMS (microelectromechanical systems) sensors, surface acoustic wave (SAW)/bulk acoustic wave (BAW) filters or quartz/silicon resonators.

Highly sensitive chips of the type mentioned are predominantly incorporated into cavity casings formed from a ceramic or a polymer material. The component can subsequently be closed with a metal cover by adhesive bonding, soldering or welding. Such a design of a cased component imposes limits on the miniaturization that can be achieved.

Less stress-sensitive components are therefore often adhesively bonded to a carrier element, for example a frame structure (leadframe) or a panel, electrically contact-connected to the carrier element and directly encapsulated with a thermosetting plastic molding compound. In the case of this design, however, an unimpeded stress transfer as a result of internally thermomechanically mismatched materials or else a stress transfer from outside to the sensitive chip takes place, as a result of which the accuracy and reproducibility of the electrical parameters of the component are impaired. In particular, reliability problems arise with regard to the functional capability of the chip in the event of temperature cycles.

It is desirable to specify a cased electrical component in which a stress exerted on a chip of the component on account of thermomechanical loading is reduced. Furthermore, the intention is to specify a method for producing a cased electrical component in which the stress on a chip in the interior of the housing that is exerted on account of a thermomechanical loading is reduced.

A cased electrical component comprises a carrier substrate, a spring device which is arranged on the carrier substrate, a chip, which is coupled to the spring device at a first side of the chip, and a covering element, which is arranged on the carrier substrate. The covering element is arranged over the chip in such a way that the covering element touches the chip at least at a second side of the chip, said second side being different from the first side.

The component has a small space requirement and a high impermeability with respect to influences from the environment. With the use of a carrier substrate composed of a ceramic and a covering element having a layer composed of metal, a continuous metal and ceramic encapsulation without abutment joints can be realized circumferentially around the chip. What is essential in this case is, in particular, the fixed and impermeable connection at the transition between ceramic and metal, which can be realized by means of a sputtering process, for example.

A method for producing a cased electrical component comprises providing a carrier substrate. A spring device is arranged on the carrier substrate. A chip is arranged on the spring device in such a way that a first side of the chip is coupled to the spring device. A covering element is arranged over the chip in such a way that the covering element touches the chip at least at a second side of the chip, said second side being different from the first side.

Further embodiments of the cased electrical component and of the method for producing the cased electrical component can be gathered from the dependent claims.

The invention is explained in greater detail below with reference to figures showing exemplary embodiments of the present invention.

Figure 2:
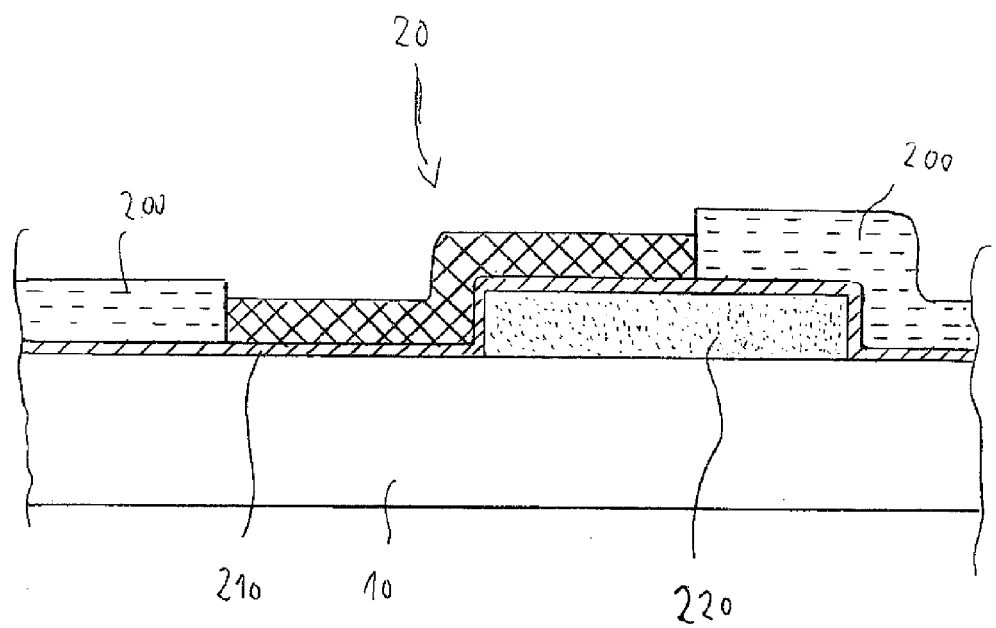
Figure 3:
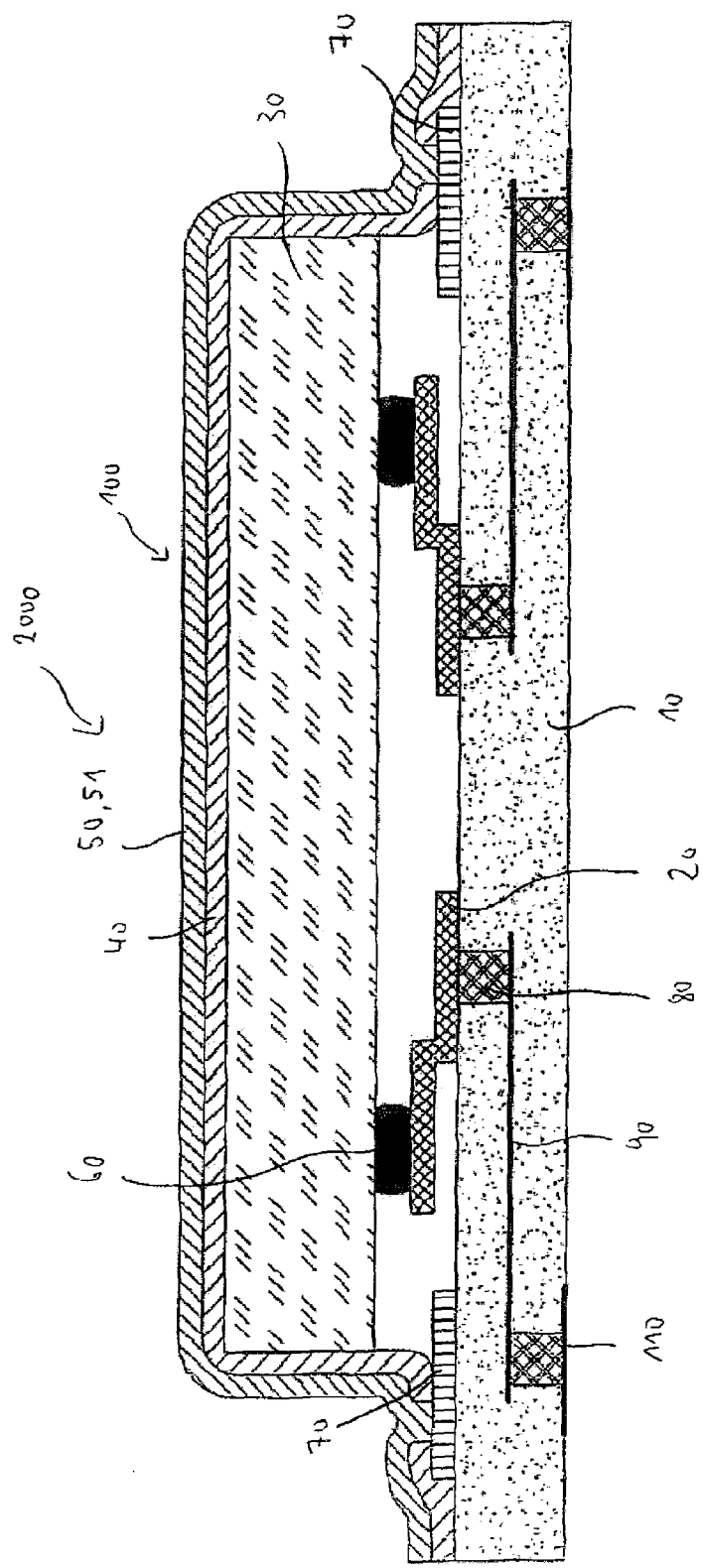
Figure 4:
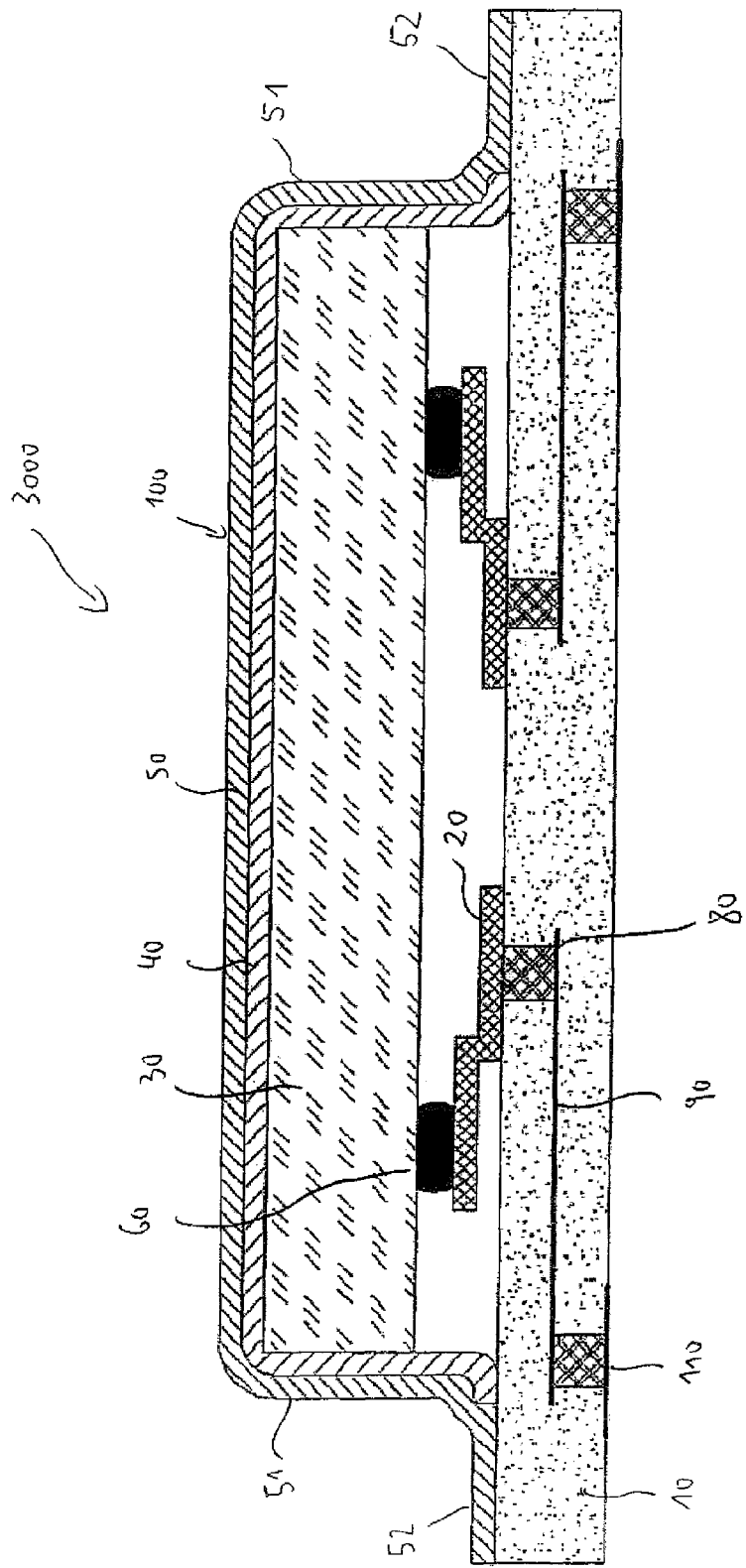
Figure 5:
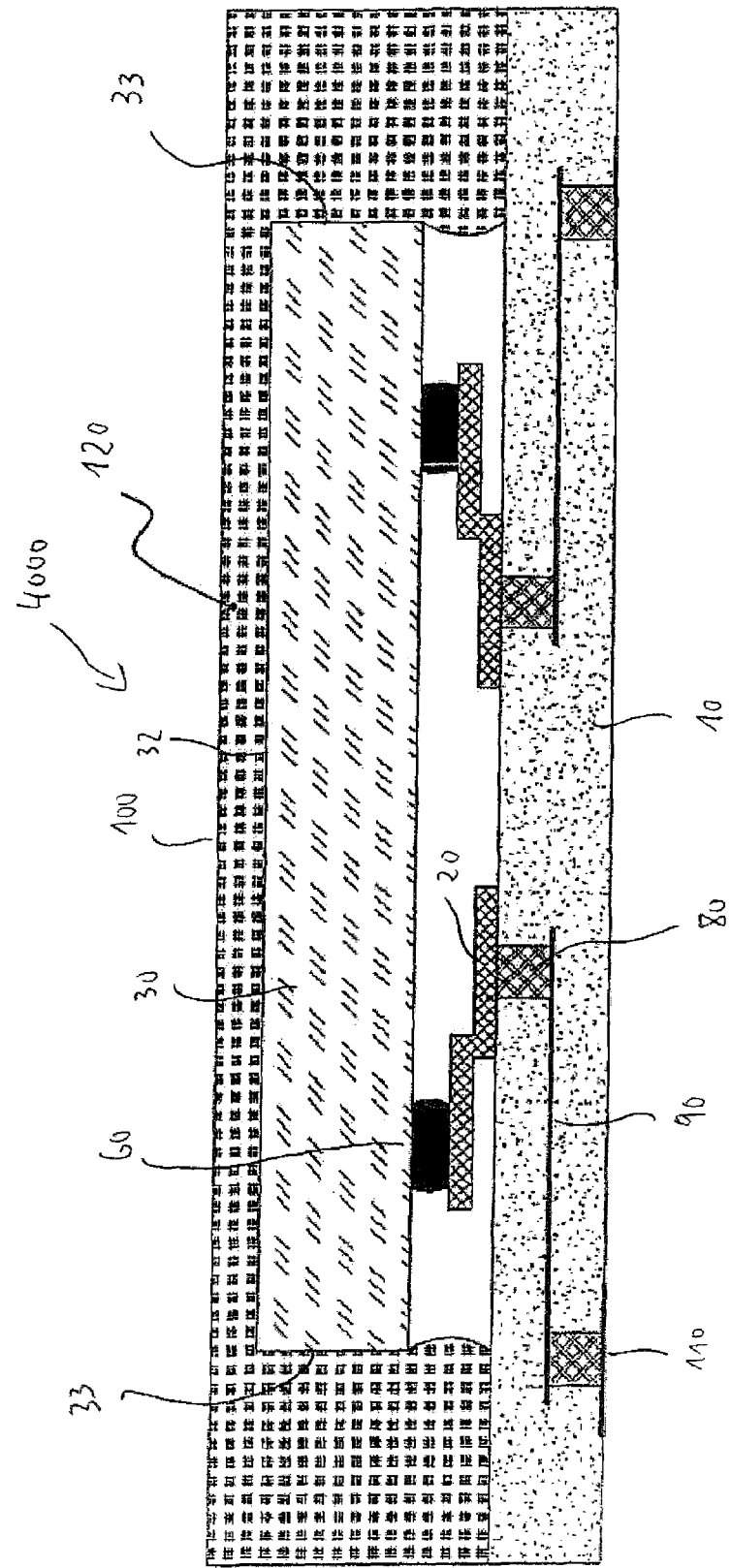

In the figures:

FIG. 1 shows a first embodiment of a cased electrical component with reduction of the stress exerted on a chip on account of thermomechanical loading, FIG. 2 shows a spring device as contact element for making contact with the chip in an enlarged illustration, FIG. 3 shows a further embodiment of a cased electrical component with reduction of the stress exerted on a chip on account of thermomechanical loading, FIG. 4 shows a further embodiment of a cased electrical component with reduction of the stress exerted on a chip on account of thermomechanical loading, FIG. 5 shows a further embodiment of a cased electrical component with reduction of the stress exerted on a chip on account of thermomechanical loading.

FIG. 1 shows an embodiment 1000 of a cased electrical component comprising a carrier substrate 10, on which a chip 30 is arranged. The chip can comprise a substrate, for example, in or on which an integrated circuit is contained. In the case of a surface or bulk acoustic wave component, the chip 30 can have a carrier substrate, for example, on which metallic structures for exciting a surface acoustic wave or a bulk acoustic wave are arranged. The chip 30 is arranged on a spring device 20. The chip can be placed onto the spring device using flip-chip mounting, for example. The spring device is embodied as a resilient, conductive contact element, by means of which the contact areas of the chip are connected to external contact connections 110 of the component for applying and/or tapping off a signal. The carrier substrate can be embodied as a multilayer carrier having, at its underside, the contact connections 110 for externally making contact with the chip 30. In the exemplary embodiment in FIG. 1, the carrier substrate 10 contains holes 80, so-called vias, which are lined or filled with a conductive material, for example a metal. The holes 80 are arranged in a manner offset with respect to one another. For connecting the vias 80, conductor track runs 90 are arranged within the carrier substrate.

The spring devices 20, which have the function of a resilient contact element alongside their function as resilient mounts for the chip, are arranged on the top side of the carrier substrate facing the interior of the component. Each of the two spring devices has a layer 21 arranged above one of the vias 80. A further respective layer 22 of the spring devices 20 is connected at its end E22a to the layer 21. A further end E22b of the layer 22 is arranged in a freely movable fashion above the carrier substrate. The layer 22 thus forms a spring arm of the spring device 20, which is arranged at its end E22a on the layer 21, which serves as a holding arm for the spring arm.

The contact areas of the chip 30 are in each case connected to the respective spring device 20, in particular to the spring arm 22 of the spring device, by means of a connecting element 60. In the case of flip-chip mounting of the chip 30 on the resilient contact elements 20, the connecting elements 60 can be embodied for example as solder bumps, soldered metal posts (pillars), gold stud bumps or conductive adhesive bumps.

In the case of the embodiment 1000 of a cased electrical component as shown in FIG. 1, a bearing element 70 is arranged on the carrier substrate 10. The bearing element 70 can be embodied as a frame of the cased component, on which the chip bears at the edge side. The frame can be a part of the carrier. In one preferred embodiment, the bearing element comprises a material composed of a metal and can be constructed on the carrier substrate in an additive process.

A covering element 100 is arranged over the chip 30 in such a way that the covering element touches the chip 30 at least at a side 32 of the chip. In the case of the embodiment of the cased electrical component as shown in FIG. 1, the covering element touches the chip at a total of five main surfaces, in particular at the surface of the top side 32 and at the side areas 33. The covering element 100 can have a layer 40 which can be embodied as a laminate layer. The laminate can be a polymer film, in particular a "B-stage" material, which is closely fitted to the surfaces of the chip by means of a thermoforming process and is subsequently cured.

The layer 40 is embodied in such a way that a section 41 of the layer 40 touches the surfaces of the top side 32 and of the side areas 33 of the chip 30. The section 41 of the layer 40 can be closely fitted directly to the surfaces of the top side and of the side areas of the chip. In one preferred embodiment, the layer 40 of the covering element touches the entire surface of the top side 32 and of the side areas 33 of the chip. A further section 42 of the layer 40 is arranged on the carrier substrate. Between the section 41 and the section 42, the layer 40 has a section 43, which touches the bearing element 70. The layer 40 thus clings to the carrier substrate in the region of the section 42 and to the bearing element 70 in the region of the section 43.

The covering 100 has a further layer 50, which is arranged over the layer 40. The layer 50 can be embodied for example as a layer sequence comprising a thin, for example sputtered, lower layer (seed layer) and a reinforcing layer electrodeposited on the lower layer. The seed layer can have a thickness of between 0.1 µm and 2 µm, for example. It can contain a material composed of titanium, tungsten, chromium and/or copper. The reinforcing layer can have a layer thickness of between 10 µm and 100 µm and contain copper and/or nickel, for example.

The layer 50 has a section 51, which touches the layer 40. In the case of the embodiment of the cased electrical component as shown in FIG. 1, the section 51 of the layer 50 clings to the layer 40 tightly and without an intermediate gap. In the region of the section 43, the layer 40 has a cutout 44, into which the material of the layer 50 extends. A connection between the layer 50 and the bearing element 70 is formed as a result. If the layer 50 is formed from a metallic material and is connected to the likewise preferably metallic frame 70 through the cutout 44 in the laminate layer 40, this punctiform link enables an electrical contact. If the carrier substrate 10, on which the bearing element 70 is arranged, is connected to a suitable (ground) potential, a good electromagnetic shielding effect is achieved by means of the covering element 100, in particular by means of the electrically conductive part 50 of the covering 100, with respect to the chip. A circumferential linear link of the layer 50 to the bearing element 70 furthermore enables a hermetically diffusion-impermeable termination.

The carrier substrate 10 is preferably an arrangement comprising an HTCC (high temperature cofired ceramics) ceramic or an LTCC (low temperature cofired ceramics) ceramic in which all the functional elements, in particular the base area, the vias, the internal conductor runs, the soldering pads and contact connections embodied for example using SMT (surface mounted technology), are constructed and jointly sintered using multilayer technology. However, further design possibilities are conceivable. By way of example, an organic carrier in the form of a printed circuit board can be used for the carrier substrate.

In accordance with one possible method for applying the structures of the spring devices 20 and of the bearing element 70 on the carrier substrate 10, the bearing element 70 can be arranged on the carrier substrate 10 by firstly a lower layer (seed layer) being sputtered onto the currier substrate 10 over the whole area. This is followed by masking of the lower layer and layer electrodeposition, for example of copper and/or nickel, in the mask openings. Afterward, the mask it removed and the lower layer is etched away. In order to obtain a level bearing that is as planar as possible for the chip, the bearing element 70 can be mechanically reworked on its top side, for example by milling or grinding. This already achieves a certain degree of impermeability and a very high compressive loading capacity in processes that possibly follow later, in particular in the event of an injection-molding encapsulation at the assembly level. The bearing element can be embodied in a frame-type fashion.

The resilient contact elements 20 can be produced by a method of the same type as that for the frame 70 and preferably directly in the same step. In this case, it is possible to further thicken the frame 70 in a second layer deposition in order to obtain a height that is significantly above that of the spring device 20. Suitable materials for the resilient contact elements 20 are, for example, copper and nickel with a total thickness in the range of between 10 µm and 100 µm. Depending on contact-making methods with respect to the chip it is possible to add further layers, for example silver, palladium, gold, tin or soldering resist films.

FIG. 2 shows the production of the spring device 20 on the carrier substrate 10. The illustration shows a section of the carrier substrate 10 on which the spring devices 20 are arranged. Firstly, a sacrificial layer 220 is applied on the carrier substrate 10 and patterned in such a way that the sacrificial layer is arranged only on a part of the carrier substrate. A lower layer (seed layer) 210 is subsequently applied over the free carrier substrate 10 and the sacrificial layer 220. The lower layer 210 can be applied by sputtering. A plating resist layer 200 is subsequently applied and patterned in the manner shown in FIG. 2, such that a region remains free between the two sections of the plating resist layer 200. The electrodeposition of the spring element 20 is effected in this region. The plating resist layer 200 is subsequently removed. Afterward, the uncovered seed layer 210 is removed. The photoresist layer 220 can have a thickness of between typically 1 µm and 50 µm. The sacrificial layer 220 can be removed in order to obtain the spring effect of the spring arm 22 in a later step. The sacrificial layer 220 can also be embodied such that it is so soft that it can remain below the contact location 22 of the spring device.

Alongside the offset of the carrier arm 21 and of the spring arm 22 in the transverse view of the component, the carrier arm and the spring arm can also be arranged in the manner offset laterally with respect to one another in the plan view of the component. In the plan view, the carrier arm 21 and the spring arm 22 are preferably not arranged exactly rectilinearly, as a result of which tensile and compressive stresses can be better alleviated by the spring device in a longitudinal direction.

In one preferred embodiment, the height of the bearing element 70 approximately corresponds to the sum of the sacrificial layer thickness, the thickness of the spring arm and the thickness of the connecting element between chip and spring device in the connected state. The connecting element can be, for example, a compressed gold stud bump or a collapsed solder ball. It has proved to be particularly expedient if the height shrinkage of the connecting element 60 during the production of the connection corresponds at least to the thickness of the sacrificial layer 220. In this case, during placement of the chip 30, the spring device 20 is elastically pressed down as far as a stop, that is to say onto the carrier substrate surface, which is useful or absolutely necessary depending on the connecting method.

FIG. 3 shows an embodiment 2000 of the cased electrical component. Component parts identical to those in the embodiment in FIG. 1 are designated by the same reference signs in FIG. 3. In the case of the embodiment of the cased component as shown in FIG. 3, the bearing element 70 has a smaller height in comparison with the embodiment shown in FIG. 1. A bearing element having a smaller height than the spring device 20 is preferably used when the bearing element 70 is already prefabricated on the carrier substrate 10 or the method used has a limitation with regard to the thickness of the bearing element 70. By contrast, if the bearing element 70 is constructed by electrodeposition, then it is generally more cost-effective for the bearing element to be shaped exclusively from the material layer from which the springs are also constructed. As a result, the bearing element generally also has approximately the thickness of the spring device. In the case of the embodiment of the cased component as illustrated in FIG. 3, the chip 30 is held only by the spring device 20. Since the chip does not bear on the bearing element 70, the leveling of the surface of the bearing element can be omitted.

FIG. 4 shows an embodiment 3000 of a cased electrical component without a bearing element 70. Otherwise, identical component parts are designated by the same reference signs as in FIGS. 1 and 3. In the case of the embodiment of the component as shown in FIG. 4, a hermetic termination can be realized by virtue of the fact that the layer 40, for example a laminate layer, does not cover the carrier substrate 10, for example a ceramic, in the outer region and the layer 50, for example a metallic cover layer (plating), is adjacent to the laminate layer 40 and is arranged on the outer region of the carrier substrate. The layer 50 therefore has a section 51, which touches the entire surface of the laminate layer 40. Furthermore, the cover layer 50 has a section 52, which is adjacent to the section 51 and which bears directly on the carrier substrate 10 and touches the carrier substrate. A hermetic termination can be realized by the sputtering and the electrodeposition of the metallic cover layer 50 on the carrier substrate 10.

FIG. 5 shows an embodiment 4000 of the cased electrical component, in which a hermetically diffusion-impermeable encapsulation of the chip is dispensed with. Instead of the provision of a covering element comprising a laminate layer and a metallic cover layer arranged thereover, the surfaces of the top side 32 and the surfaces of the side areas 33 of the chip are embedded into a thick polymer layer 120, for example a glob top layer. The polymer 120 can be applied for example by laminating, spraying, dipping or potting, wherein the polymer material, by means of suitable process control, penetrates only a little into the cavity between the chip 30 and the carrier substrate 10. Multilayered arrangements can also be used. By way of example, a laminate having a lower layer, which correspondingly protects the cavity, and an upper filling layer can be provided.

Such polymer coatings can also be used in conjunction with the covering element 100 comprising the laminate layer 40 and the metallic cover layer 50, in order for example to obtain a parallelepipedal component contour. Further functional layers can be added for example for the purpose of high-contrast inscribability.

In order to keep the manufacturing costs low, preferably area arrays comprising a multiplicity of cased components according to one of the embodiments shown in FIGS. 1, 3, 4 and 5 are processed jointly and are singulated only in an advanced or in a fully completed state. Cased components having the construction of the covering as shown in FIGS. 1 and 3 to 4 thus enable very efficient panel manufacture with a high degree of miniaturization.

LIST OF REFERENCE SIGNS

10 Carrier substrate
20 Spring device
21 Holding arm
22 Spring arm
30 Chip
40 Layer of the covering element
50 Cover layer of the covering element
60 Connecting element
70 Bearing element/frame
80 Metal hole/via
90 Conductor track run
100 Covering element
110 External contact connection
120 Polymer layer/glob top layer
200 Plating resist layer
210 Lower layer/seed layer
220 Photoresist layer

The invention claimed is:

1. A cased electrical component, comprising:
   a carrier substrate;
   a spring device arranged on the carrier substrate;
   a chip coupled to the spring device at a first side of the chip;
   a covering element arranged on the carrier substrate,
      wherein the covering element is arranged over the chip such that the covering element touches the chip at least at a second side of the chip, the second side being different from the first side,
      wherein the covering element has at least one first layer comprising a plastic material and at least one second layer, arranged on the first layer, comprising a metal, and
      wherein the first layer of the covering element has a first section touching the chip at the at least one second side of the chip; and
   a bearing element arranged on the carrier substrate,
      wherein the bearing element is embodied such that the first side of the chip at least partly bears on the bearing element,
      wherein the first layer of the covering element has a second section touching the bearing element and a third section arranged on the carrier substrate, wherein the second section of the first layer of the covering element has a cutout, and wherein the second layer of the covering element is contact-connected to the bearing element through the cutout.

2. The cased electrical component according to claim 1, wherein the spring device has at least one carrier arm and a spring arm, wherein the carrier arm is arranged on the carrier substrate, wherein one end of the spring arm is fixed to the at least one carrier arm and a further end of the spring arm is arranged in a movable fashion above the carrier substrate, and wherein the carrier arm and the spring arm are arranged in a manner offset laterally with respect to one another in a plan view of the component.

3. The cased electrical component according to claim 2, further comprising:

a connecting element for connecting the chip to the spring device, wherein the bearing element has a height corresponding to a sum of a height of the connecting element, of the spring arm and of the at least one carrier arm above the carrier substrate.

4. The cased electrical component according to claim 1, wherein the chip bears in a movable fashion on the bearing element.

5. The cased electrical component according to claim 1, wherein the second section of the first layer of the covering element is between the third section of the first layer of the covering element and the first section of the first layer of the covering element.

6. The cased electrical component according to claim 1, wherein the carrier substrate has a conductor track and a contact connection, wherein the spring device is embodied as a resilient conductive contact element coupled to the conductor track of the carrier substrate, and wherein the chip is connected to the contact connection of the carrier substrate by means of the spring device and the conductor track of the carrier substrate.

* * * * *